(12) United States Patent
Chen (10) Patent No.: US 7,177,184 B2
(45) Date of Patent: *Feb. 13, 2007

(54) SELECTIVE OPERATION OF A MULTI-STATE NON-VOLATILE MEMORY SYSTEM IN A BINARY MODE

(75) Inventor: Jian Chen, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 10/818,926

(22) Filed: Apr. 5, 2004

(65) Prior Publication Data

US 2004/0190337 A1 Sep. 30, 2004

Related U.S. Application Data

(63) Continuation of application No. 10/229,258, filed on Aug. 26, 2002, now Pat. No. 6,717,847, which is a continuation of application No. 09/956,340, filed on Sep. 17, 2001, now Pat. No. 6,456,528.

(51) Int. Cl.
*G11C 16/04* (2006.01)

(52) U.S. Cl. .............................. 365/185.03; 365/185.11; 365/185.24

(58) Field of Classification Search ............ 365/185.03, 365/185.24, 185.11, 185.14, 185.28
See application file for complete search history.

(56) References Cited

U.S. PATENT DOCUMENTS

| | | |
|---|---|---|
| 5,043,940 A | 8/1991 | Harari |
| 5,095,344 A | 3/1992 | Harari |
| 5,172,338 A | 12/1992 | Mehrotra et al. |
| 5,187,338 A | 2/1993 | Kaigler |
| 5,287,478 A | 2/1994 | Johnston et al. |
| 5,297,148 A | 3/1994 | Harari et al. |
| 5,313,585 A | 5/1994 | Jeffries et al. |
| 5,359,569 A | 10/1994 | Fujita et al. |
| 5,369,757 A | 11/1994 | Spiro et al. |
| 5,430,859 A | 7/1995 | Norman et al. |
| 5,450,341 A | 9/1995 | Sawada et al. |
| 5,475,693 A | 12/1995 | Christopherson et al. |
| 5,479,633 A | 12/1995 | Wells et al. |
| 5,485,422 A | 1/1996 | Bauer et al. |
| 5,488,711 A | 1/1996 | Hewitt et al. |

(Continued)

FOREIGN PATENT DOCUMENTS

| | | |
|---|---|---|
| JP | 8171515 | 7/1996 |
| WO | WO09518407 | 7/1995 |
| WO | WO 01/63614 A | 8/2001 |

OTHER PUBLICATIONS

Nozaki et al., "A 1–Mb–EEPROM with MONOS Memory Cell for Semiconductor Disk Application," *IEEE Journal of Solid State Circuits*, vol. 26, No. 4, Apr. 1991, pp. 497–501.

(Continued)

*Primary Examiner*—Thong Q. Le
(74) *Attorney, Agent, or Firm*—Parsons Hsue & de Runtz LLP (57) ABSTRACT

A flash non-volatile memory system that normally operates its memory cells in multiple storage states is provided with the ability to operate some selected or all of its memory cell blocks in two states instead. The two states are selected to be the furthest separated of the multiple states, thereby providing an increased margin during two state operation. This allows faster programming and a longer operational life of the memory cells being operated in two states when it is more desirable to have these advantages than the increased density of data storage that multi-state operation provides.

25 Claims, 7 Drawing Sheets

U.S. PATENT DOCUMENTS

| | | | |
|---|---|---|---|
| 5,515,317 | A | 5/1996 | Wells et al. |
| 5,539,690 | A | 7/1996 | Talreja et al. |
| 5,546,351 | A | 8/1996 | Tanaka et al. |
| 5,570,315 | A | 10/1996 | Tanaka et al. |
| 5,574,879 | A | 11/1996 | Wells et al. |
| 5,602,987 | A | 2/1997 | Harari et al. |
| 5,606,532 | A | 2/1997 | Lambrache et al. |
| 5,640,032 | A | 6/1997 | Tomioka |
| 5,644,539 | A | 7/1997 | Yamagami et al. |
| 5,657,332 | A | 8/1997 | Auclair et al. |
| 5,663,901 | A | 9/1997 | Wallace et al. |
| 5,671,388 | A | 9/1997 | Hasbun |
| 5,712,180 | A | 1/1998 | Guterman et al. |
| 5,717,886 | A | 2/1998 | Miyauchi |
| 5,732,408 | A | 3/1998 | Takahashi |
| 5,774,397 | A | 6/1998 | Endoh et al. |
| 5,851,881 | A | 12/1998 | Lin et al. |
| 5,859,795 | A | 1/1999 | Rolandi |
| 5,862,074 | A | 1/1999 | Park |
| 5,867,429 | A | 2/1999 | Chen et al. |
| 5,890,192 | A | 3/1999 | Lee et al. |
| 5,903,495 | A | 5/1999 | Takeuchi et al. |
| 5,930,167 | A | 7/1999 | Lee et al. |
| 5,946,231 | A | 8/1999 | Endoh et al. |
| 5,982,663 | A | 11/1999 | Park |
| 6,046,935 | A | 4/2000 | Takeuchi et al. |
| 6,067,248 | A | 5/2000 | Yoo |
| 6,069,821 | A * | 5/2000 | Jun et al. ............... 365/185.21 |
| 6,097,639 | A * | 8/2000 | Choi et al. ............. 365/185.28 |
| 6,101,125 | A | 8/2000 | Gorman |
| 6,212,100 | B1 * | 4/2001 | Choi ..................... 365/185.14 |
| 6,297,988 | B1 | 10/2001 | Parker et al. |
| 6,345,001 | B1 | 2/2002 | Mokhlesi |
| 6,411,547 | B2 * | 6/2002 | Choi ..................... 365/185.14 |
| 6,426,893 | B1 | 7/2002 | Conley et al. |
| 6,456,528 | B1 * | 9/2002 | Chen ..................... 365/185.03 |
| 6,512,263 | B1 | 1/2003 | Yuan et al. |
| 6,522,580 | B2 | 2/2003 | Chen et al. |
| 6,717,847 | B2 | 4/2004 | Chen |

OTHER PUBLICATIONS

Eitan et al., "NROM: A Novel Localized Trapping, 2–Bit Nonvolatile Memory Cells," *IEEE Electron Device Letters*, vol. 21, No. 11, Nov. 2000, pp. 543–545.

DiMaria et al., "Electrically–alterable read–only–memory using Si–rich $SIO_2$ injectors and a floating poly–crystalline silicon layer," *J. Appl. Phys.* 52(7), Jul. 1981, pp. 4825–4942.

Hori et al., "A MOSFET with Si–implanted Gate–$SiO_2$ Insulator for Nonvolatile Memory Applications," *IEDM 92*, Apr. 1992, pp. 469–472.

Lee, Jae–Duk et al., "Effects of Parasitic Capacitance on NAND Flash Memory Cell Operation," *IEEE—Non–Volatile Semiconductor Memory Workshop*, Hyatt Regency Monterey One Golf Course Road—Monterey, CA 93940, Aug. 12–16, 2001, pp. 90–92.

Aritone, S., et al., "A $0.67um^2$ Self–Aligned Shallow Trench Isolation Cell (SA–STI CELL) for 3V–only 256Mbit NAND EEPROMs," *IEDM Technical Digest*, pp. 61–64 (1994).

Hemink, G.J., et al., "Fast and Accurate Programming Method for Multi–level NAND EEPROMs," *Digest of 1995 Symposium on VLSI Technology*, pp. 129–130.

Chan et al., "A True Single–Transistor Oxide–Nitride–Oxide EEPROM Device," *IEEE Electron Device Letters*, vol. EDL–8, No. 3, Mar. 1987, pp. 93–95.

International Search Report from corresponding PCT case PCT/US02/29177, PCT Searching Authority, Feb. 4, 2003, 4 pages.

Anand, M.B., et al., "NURA: A Feasible Gas–Dielectric Interconnect Process," *1996 Symposium on VLSI Technology Digest of Technical Papers*, pp. 82–83.

Zhao, B., et al., "Reliability and Electrical Properties of New Low Dielectric Constant Interlevel Dielectrics for Hiigh Performance ULSI Interconnect," *IEEE*, pp. 156–163 (1996).

Choi, J.D., et al., "A Novel Booster Plate Technology in High Density NAND Flash Memories for Voltage Scaling–Down and Zero Program Disturbance," *1996 Symposium on VLSI Technology Digest of Technical Papers*, pp. 238–239.

List, R.S., et al., "Integration of Ultra–Low–k Xerogel Gapfill Dielectric for High Performance Sub–0.18 μm Interconnects," *1997 Symposium on VLSI Technology Digest of Technical Papers*, pp. 77–78.

Takeuchi, Ken et al., "A Multipage Cell Architecture for High–Speed Programming Multilevel NAND Flash Memories", IEEE Journal of Solid–State Circuits, vol. 33, No. 8, Aug. 1988, pp. 1228–1238.

EPO, "Supplementary European Search Report", mailed in related European application No. EP02798963 on Nov. 5, 2004, 1 page.

EPO, "Examiner's Report", mailed in related European application No. EP02798963.1 on Feb. 15, 2005, 3 pages.

* cited by examiner

| | Erase | Program Promotion | Program Inhibition | Read10 | Read10 for 1st Pass | Read10 for 2nd Pass | Read00 | Read00 for 2nd Pass | Read01 | Verify10 for 1st Pass | Verify10 for 2nd Pass | Verify00 for 1st Pass | Verify00 for 2nd Pass | Verify01 |
|---|---|---|---|---|---|---|---|---|---|---|---|---|---|---|
| BLe | Floating | 0V | Vdd | H or L | H or L | H or L | H or L | H or L | H or L | H or L | H or L | H or L | H or L | H or L |
| BLo | Floating | Vdd | Vdd | 0V | 0V | 0V | 0V | 0V | 0V | 0V | 0V | 0V | 0V | 0V |
| SGD | Floating | Vdd | Vdd | 4.5V | 4.5V | 4.5V | 4.5V | 4.5V | 4.5V | 4.5V | 4.5V | 4.5V | 4.5V | 4.5V |
| WL3 | 0V | 10V | 10V | 4.5V | 4.5V | 4.5V | 4.5V | 4.5V | 4.5V | 4.5V | 4.5V | 4.5V | 4.5V | 4.5V |
| WL2 | 0V | Vpgm | Vpgm | 0V | 0V | 0V | 1V | 1V | 2V | 0.2V | 0.4V | 1.2V | 1.4V | 2.4V |
| WL1 | 0V | 10V | 10V | 4.5V | 4.5V | 4.5V | 4.5V | 4.5V | 4.5V | 4.5V | 4.5V | 4.5V | 4.5V | 4.5V |
| WL0 | 0V | 10V | 10V | 4.5V | 4.5V | 4.5V | 4.5V | 4.5V | 4.5V | 4.5V | 4.5V | 4.5V | 4.5V | 4.5V |
| SGS | Floating | 0V | 0V | 4.5V | 4.5V | 4.5V | 4.5V | 4.5V | 4.5V | 4.5V | 4.5V | 4.5V | 4.5V | 4.5V |
| C-source | Floating | 0V | 0V | 0V | 0V | 0V | 0V | 0V | 0V | 0V | 0V | 0V | 0V | 0V |
| C-p-well | 20V | 0V | 0V | 0V | 0V | 0V | 0V | 0V | 0V | 0V | 0V | 0V | 0V | 0V |

SELECTIVE OPERATION OF A MULTI-STATE NON-VOLATILE MEMORY SYSTEM IN A BINARY MODE

RELATED APPLICATIONS

This application is a continuation of U.S. patent application Ser. No. 10/229,258, filed Aug. 26, 2002, now U.S. Pat. No. 6,717,847, which is in turn a continuation of U.S. patent application Ser. No. 09/956,340, filed Sep. 17, 2001, now U.S. Pat. No. 6,456,528.

FIELD OF THE INVENTION

This invention relates generally to a non-volatile memory and its operation, and, more specifically, to techniques for selectively operating a multi-state memory in a lesser number of states than it is capable of operating.

BACKGROUND OF THE INVENTION

The principles of the present invention have application to various types of non-volatile memories, those currently existing and those contemplated to use new technology being developed. Implementations of the present invention, however, are described with respect to a flash electrically erasable and programmable read-only memory (EEPROM), wherein the storage elements are floating gates, as exemplary.

It is common in current commercial products for each floating gate storage element of a flash EEPROM array to store a single bit of data by operating in a binary mode, where two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate storage element) now being included in commercial products. More storage states, such as 16 states per storage element, are contemplated. Each floating gate memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the floating gate storage elements decreases. Since the ranges of charge designated for each storage state must necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual shifts in the charge stored in one cell can be disturbed when the state of that cell, and when reading, programming and erasing other cells that have some degree of electrical coupling with the that cell, such as those in the same column or row, and those sharing a line or node.

Apparent shifts in the stored charge occur because of field coupling between storage elements. The degree of this coupling is necessarily increasing as the sizes of memory cell arrays are being decreased as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appear to be different than programmed because of the effect of the charge on the second set of floating gates being coupled with the first. This is known as the Yupin effect, and is described in U.S. Pat. Nos. 5,867,429 and 5,930,167, which patents are incorporated herein in their entirety by this reference. These patents describe either physically isolating the two sets of floating gates from each other, or taking into account the effect of the charge on the second set of floating gates when reading that of the first. Further, U.S. Pat. No. 5,930,167 describes methods of selectively programming portions of a multi-state memory as cache memory, in only two states or with a reduced margin, in order to shorten the time necessary to initially program the data. This data is later read and re-programmed into the memory in more than two states, or with an increased margin.

This effect is present in various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. No. 09/505,555, filed Feb. 17, 2000, now U.S. Pat. No. 6,426,893, and Ser. No. 09/667,344, filed Sep. 22, 2000, now U.S. Pat. No. 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patents that are incorporated herein in their entirety by this reference: U.S. Pat. Nos. 5,570,315, 5,774,397 and 6,046,935. Briefly, two bits of data from different logical pages of incoming data are programmed into one of four states of the individual cells in two steps, first programming a cell into one state according to one bit of data and then, if the data makes it necessary, re-programming that cell into another one of its states according to the second bit of incoming data.

Another potentially adverse effect of increasing the number of programming states of the individual memory cells is a reduction of the life of the memory cells in terms of the number of erase/programming cycles that they can endure. This is due to the higher precision of programming that is required to store multiple states in a cell. Because of charge that becomes trapped in dielectrics after repetitive use, and other factors, it can take more time to program and be more difficult to operate in multi-state with the necessary high precision after the memory cells have been placed through a large number of cycles.

SUMMARY OF THE INVENTION

Briefly and generally, a non-volatile memory system and method of operating it are provided, in which at least four states are normally programmed into each memory cell storage element, thereby storing at least two bits per cell, but with the provision for storing fewer states per storage element on a selective basis when it is necessary or desirable to improve programming performance, or to extend the life of a portion of the memory in terms of the number of erase and programming cycles that can be endured, or to obtain some other benefit. At least four states are normally provided in a memory cell by programming the storage element of the cell into one of at least four threshold level ranges that are separated from each other across an operating window of threshold levels. When switched to storing only two states, as an example of storing fewer states than normal, two of the at least four threshold level ranges are used that are separated from each other the furthest. When implemented in the four state NAND type of memory described above, bits from only one page are programmed at a time into the two threshold levels that are separated from each other by the maximum amount. Programming is switched from four to two states in a selected group of memory cells by simply causing the step of programming the second page data bits to be omitted for the selected cells.

Additional aspects, features, advantages and applications of the present invention are included in the following description of exemplary embodiments, which description should be taken in conjunction with the accompanying drawings.

DESCRIPTION OF EXEMPLARY EMBODIMENTS

Example Non-Volatile Memory System

Figure 1:
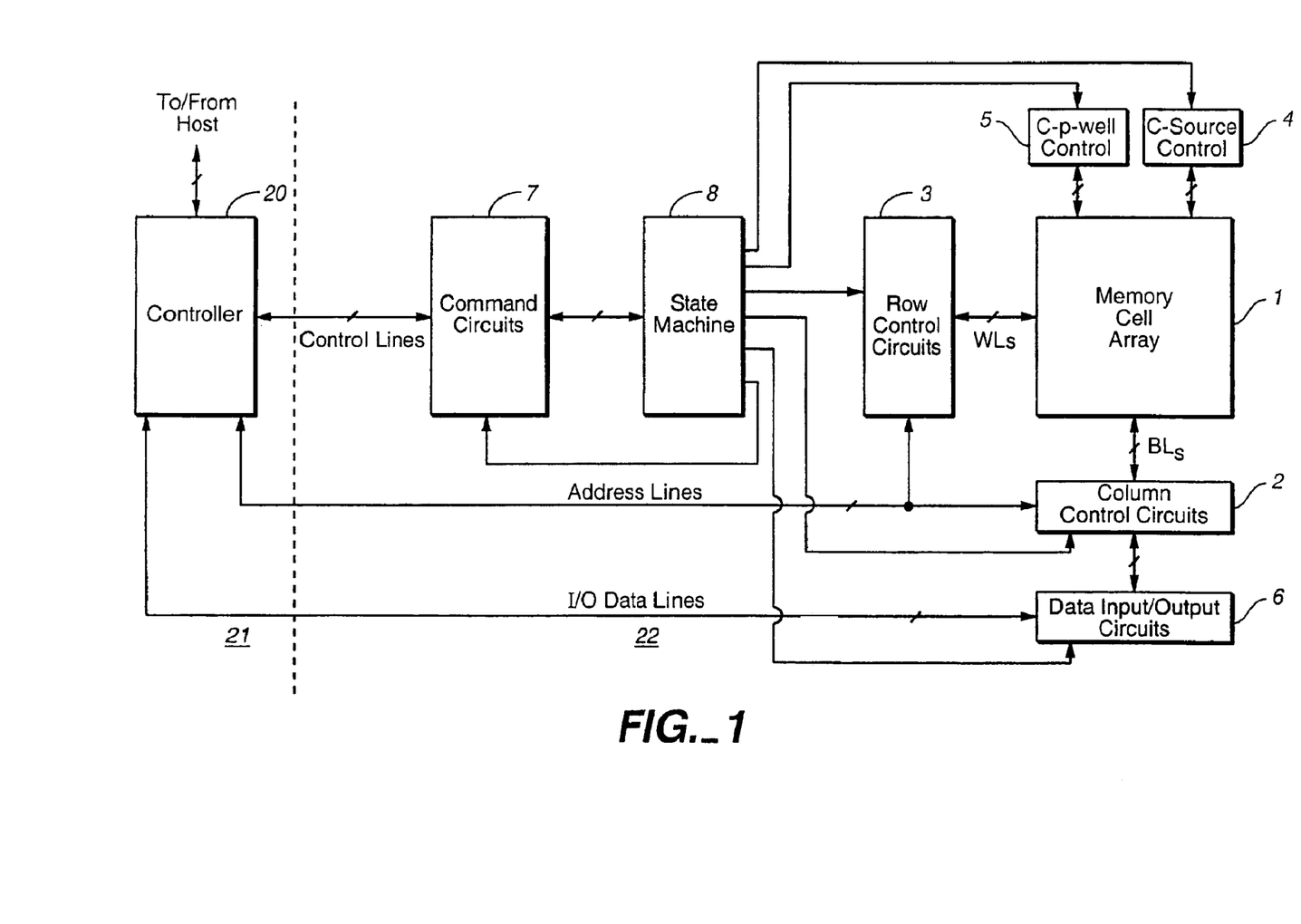
FIG. 1 is a block diagram of a non-volatile memory system in which the various aspects of the present invention are described to be implemented.

With reference to FIGS. 1–7, a specific non-volatile memory system is described in which the various aspects of the present invention are implemented, in order to provide specific examples. FIG. 1 is a block diagram of a flash memory system. Memory cell array 1 including a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of a p-type region (labeled as "c-p-well" 11 in FIG. 3) on which the memory cells (M) are formed. The c-source control circuit 4 controls a common source line (labeled as "c-source" in FIG. 2) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines that are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 2:
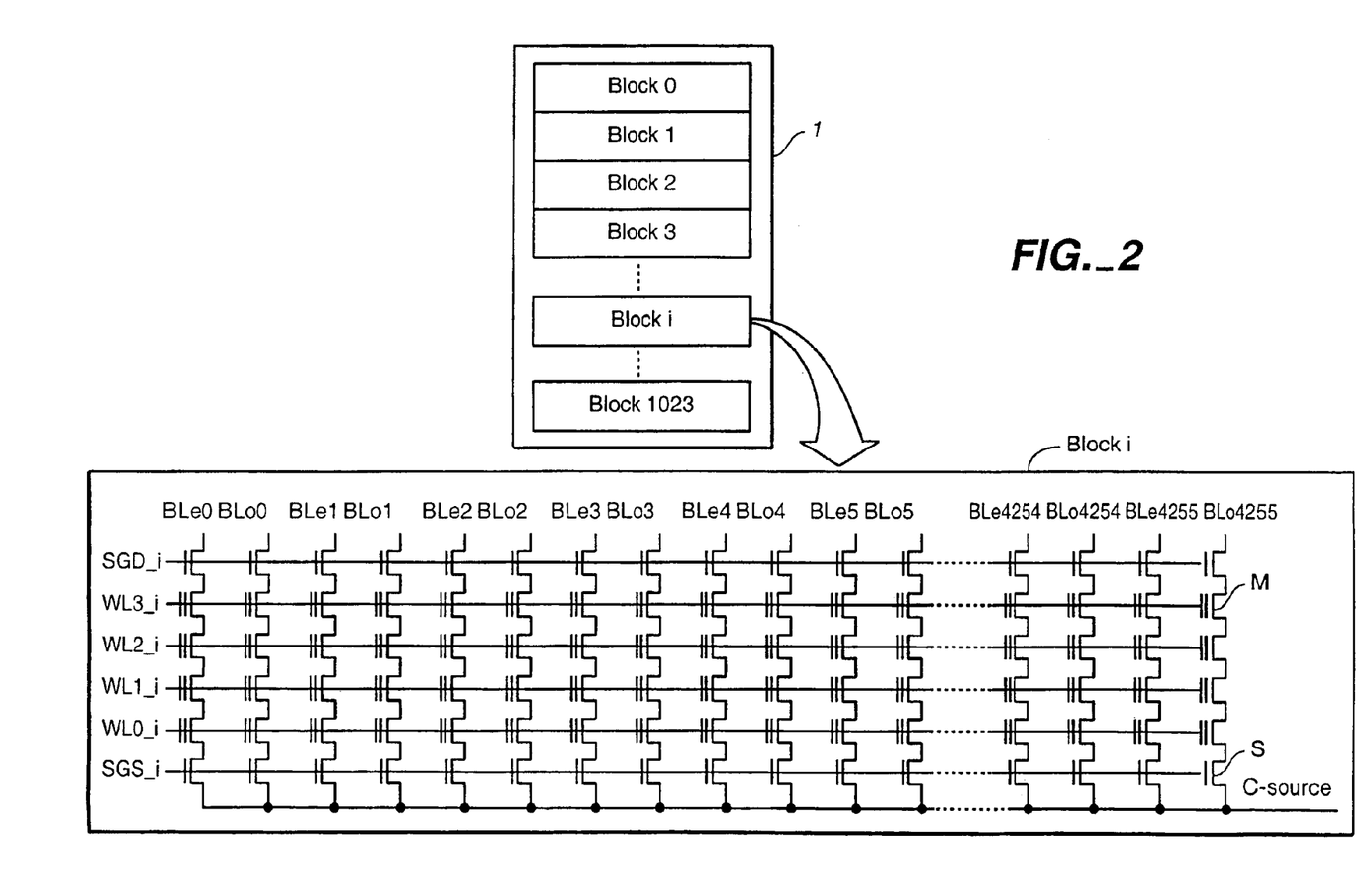
FIG. 2 illustrates an existing circuit and organization of the memory array of FIG. 1 when a NAND type.

With reference to FIG. 2, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, a higher number of transistors, such as 8, 16 or even 32, are used.

During a user data read and programming operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

Figure 3:
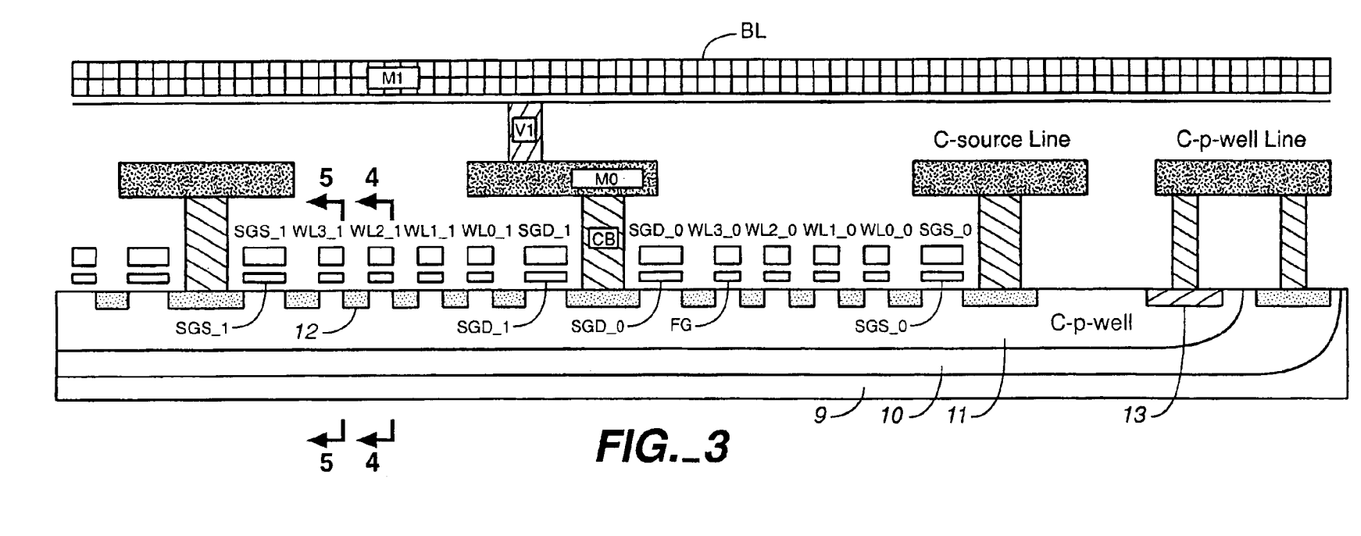
FIG. 3 shows a cross-sectional view, along a column, of a NAND type of memory array formed on a semiconductor substrate.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

Each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

Figure 4:
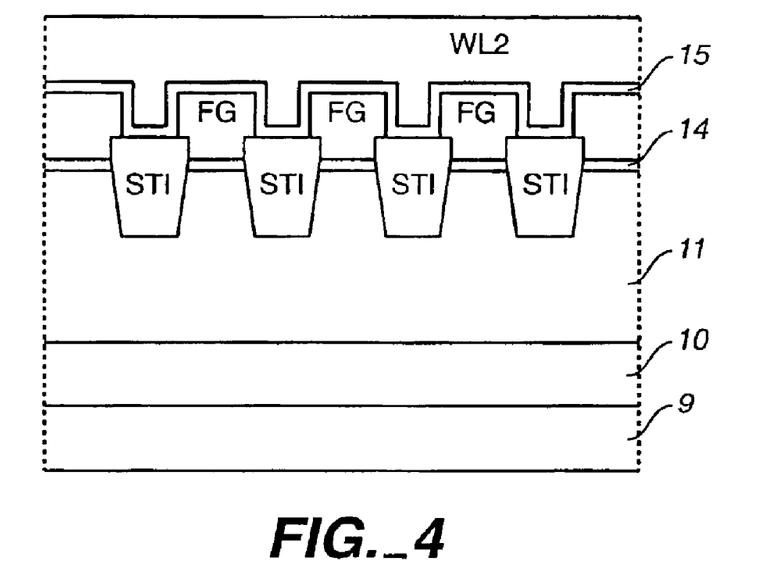
FIG. 4 is a cross-sectional view of the memory array of FIG. 3, taken at section 4—4 thereof.
Figure 5:
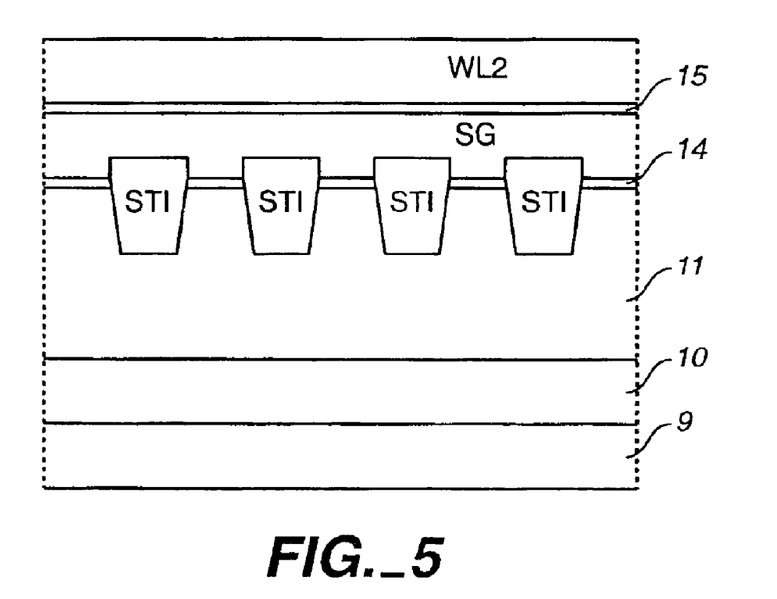
FIG. 5 is a cross-sectional view of the memory array of FIG. 3, taken at section 5—5 thereof.

FIGS. 4 and 5 show cross sectional views of a memory cell (section 4—4 of FIG. 3) and a select transistor (section 5—5 of FIG. 3), respectively, in the direction of the word line (WL2). Each column is isolated from the neighbor columns by a trench formed in the substrate and filled with isolation material, known as shallow trench isolation (STI). The floating gates (FG) are isolated from each other by the STI and insulator film 15 and word line (WL). These days, a space between the floating gates (FG) is going to less than 0.1 µm, and a capacitive coupling between the floating gates has been increasing. Since the gate electrode (SG) of the select transistor (S) is formed in the same formation process steps as the floating gate (FG) and word line (WL), it shows a stacked gate structure. These two select gate lines (SG) are shunted at the end of lines.

Figure 6:
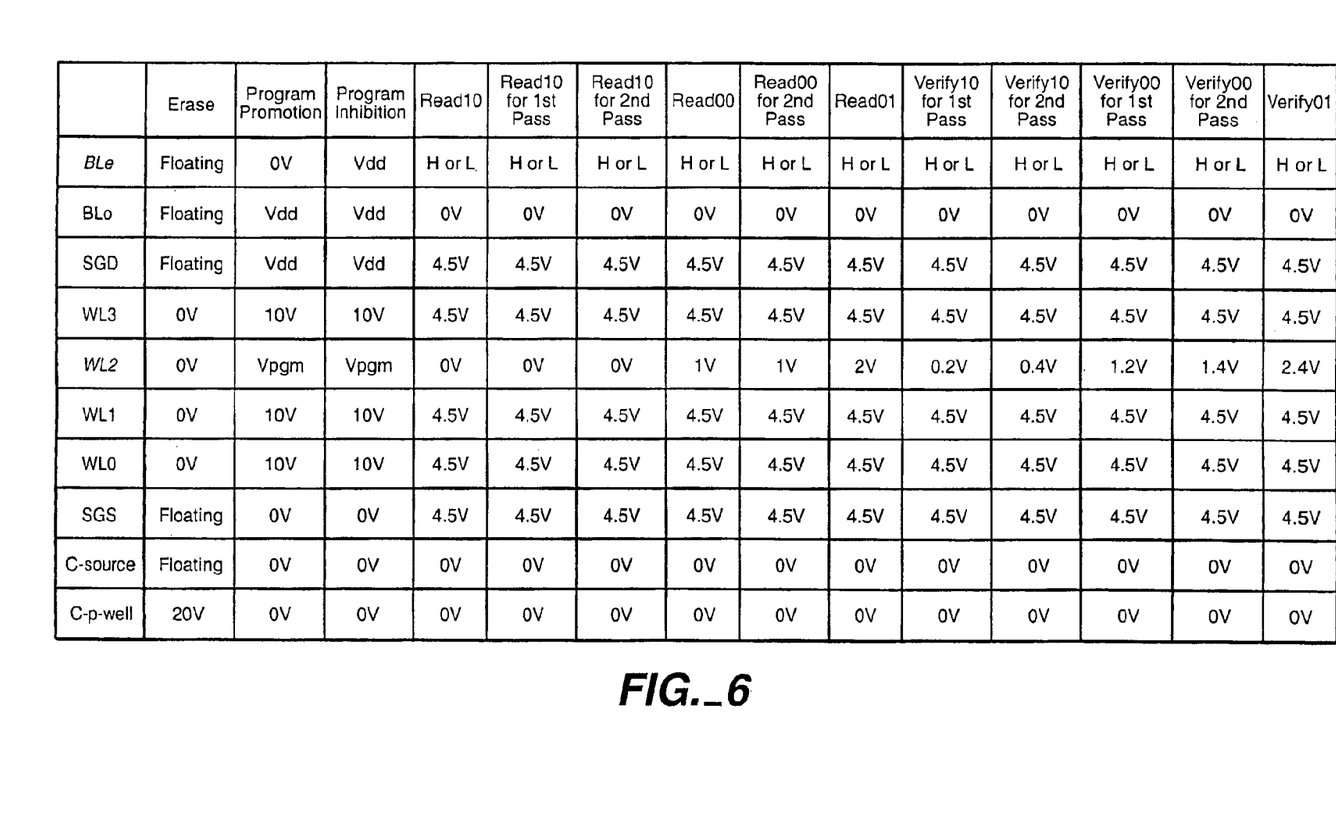
FIG. 6 provides Table 1 of example operating voltages of the NAND memory cell array of FIGS. 2–5.

Table I of FIG. 6 summarizes voltages applied to operate the memory cell array 1, in a specific example, each memory cell's floating gate storing two bits, having one of the states "11", "10", "01", "00". This table shows the case where the word line "WL2" and the bit lines of "BLe" are selected for reading and programming. By raising the c-p-well to an erase voltage of 20V and grounding the word lines (WL) of a selected block, the data of the selected block is erased. Since all of the word lines (WL) of the unselected blocks, bit lines (BL), select lines (SG) and c-source are put in a floating state, these are also raised to almost 20V due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to Vdd of a power supply, for example 3V, as well as the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01, or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage, a level of which is specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY01 operation, the selected word line WL2 is connected to 2.4V, so that it is verified that whether the threshold voltage has reached 2.4V. In this verify case, it can be said that a verify level is 2.4V.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M). Further details of the read and verify operations are explained below.

Figure 7:
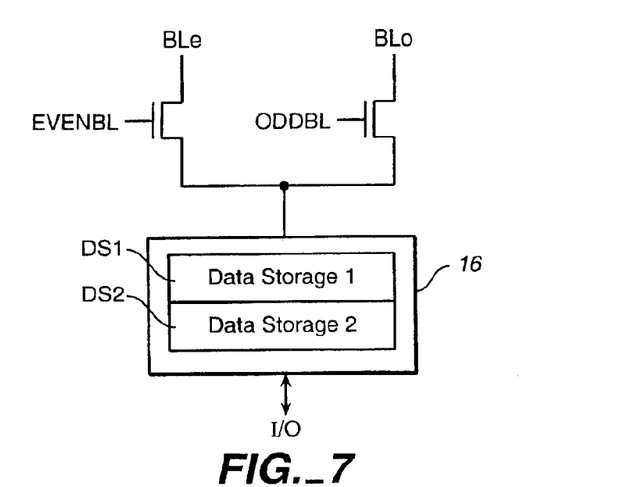
FIG. 7 illustrates another feature of the NAND memory cell array of FIGS. 2–5.

FIG. 7 shows a part of the column control circuit 2 of FIG. 1. Each pair of bit lines (BLe and BLo) is coupled to a data storage portion 16 which includes two data storage (DS1 and DS2) registers, each being capable of storing one bit of data. The data storage portion 16 senses the potential level of the selected bit line (BL) during a read or verify operation and then stores the data in a binary manner, and controls the bit line voltage in the program operation. The data storage portion 16 is selectively connected to the selected bit line (BL) by selecting one of signals of "EVENBL" and "ODDBL". The data storage portion 16 is also coupled to the I/O line to output the read data and to store the program data. The I/O line is connected to the data input/output buffer 6, as described above with respect to FIG. 1.

Operation of the Memory System with More than Two States per Storage Element

Figure 8:
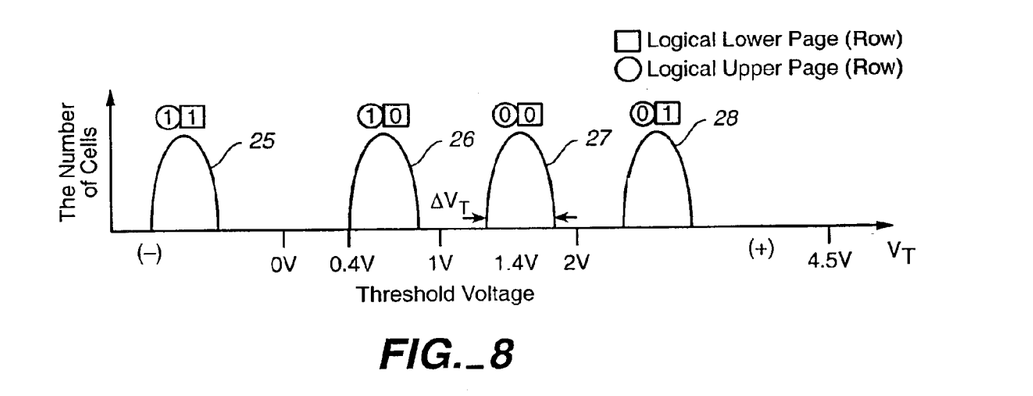
FIG. 8 shows an example existing distribution of threshold voltages of the NAND memory cell array of FIGS. 2–5 when operated in four states.

FIG. 8 illustrates threshold voltage distributions for the memory cell array 1 when each floating gate storage element stores two bits of data, namely four data states, in each memory cell (M). The curve 25 represents a distribution of the threshold levels $V_T$ of the cells within the array 1 that are in the erased state ("11" data state), being negative threshold voltage levels. Threshold voltage distributions 26 and 27 of memory cells storing "10" and "00" user data, respectively, are shown to be between 0V and 1V and between 1V and 2V. A curve 28 shows the distribution of cells that have been programmed to the "01" data state, being the highest threshold voltage level set more than 2V and less than 4.5V of the read pass voltage.

Each of the two bits stored in a single memory cell (M), in this example, is from a different logical page. That is, each bit of the two bits stored in each memory cell carries a different logical page address from each other. The right side bit shown in FIG. 8 is accessed when a lower page address (=0, 2, 4, . . . , 16,382) is input. The left side bit is accessed when an upper page address (=1, 3, 5, . . . , 16,383) is input.

In order to provide improved reliability, it is better for the individual distributions to be tightened (distribution narrowed), because the tighter distribution brings a wider read margin (distance between them). According to the present invention, the distribution width is made tighter without a conspicuous degradation in the programming speed.

According to the article "Fast and Accurate Programming Method for Multi-level NAND EEPROMs", *Digest of 1995 Symposium on VLSI Technology*, pp129–130, which article is incorporated herein by this reference, in principle, limiting a distribution to a 0.2V-width requires that the usual repetitive programming pulses be incremented 0.2V between steps. To tighten the distribution within a 0.05V-width, 0.05V-step-up pulses are required. In order to program cells with such small step increments in programming voltage, the programming time is increased by a factor of 4. However, according to the principle aspects of the present invention, described below, such significant increases in programming time are unnecessary to reduce the width of a threshold voltage distribution.

Figure 9:
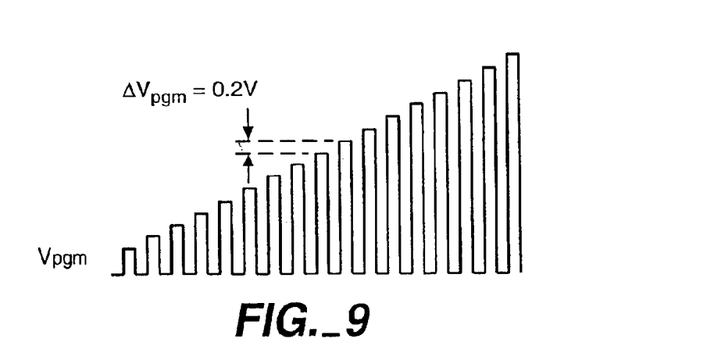
FIG. 9 shows an example programming voltage signal that may be used in the memory cell array of FIGS. 2–5.

FIG. 9 shows an existing programming pulse technique. A programming voltage Vpgm waveform is illustrated. The programming voltage Vpgm is divided into many pulses, and increased 0.2V pulse by pulse. The starting level of Vpgm is 12V, in this particular example.

In periods between the pluses, the verify (read) operations are carried out. That is, the programmed level of each cell being programmed in parallel is read between each programming pulse to determine whether it is equal to or greater than the verify level to which it is being programmed. If it is determined that the threshold voltage of a given memory cell has exceeded the verify level, Vpgm is removed by raising the voltage of the bit line to which the series cell unit of the given cell is connected from 0V to Vdd. Programming of others of the cells being programmed in parallel continues until they in turn reach their verify levels. When the threshold voltage moves from below the verify level to above it during the cell's last programming pulse, the shift of the threshold voltage is equal to the Vpgm step size of 0.2V. Therefore, the threshold voltages are controlled within a 0.2V-width.

Figure 10A:
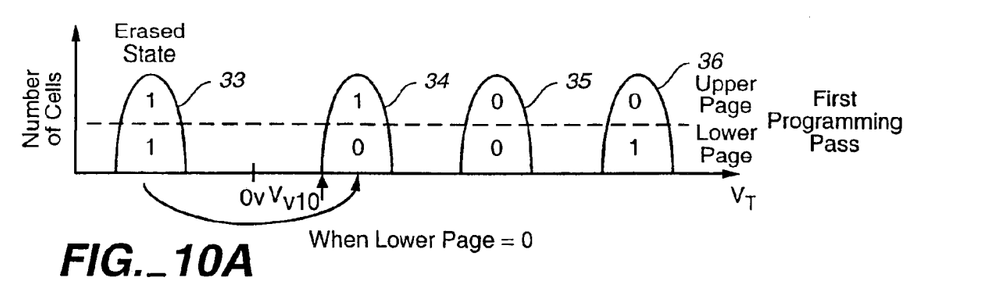
FIGS. 10A and 10B are voltage threshold level distributions that illustrate a multi-state technique for programming the memory cell array of FIGS. 2–5.
Figure 10B:
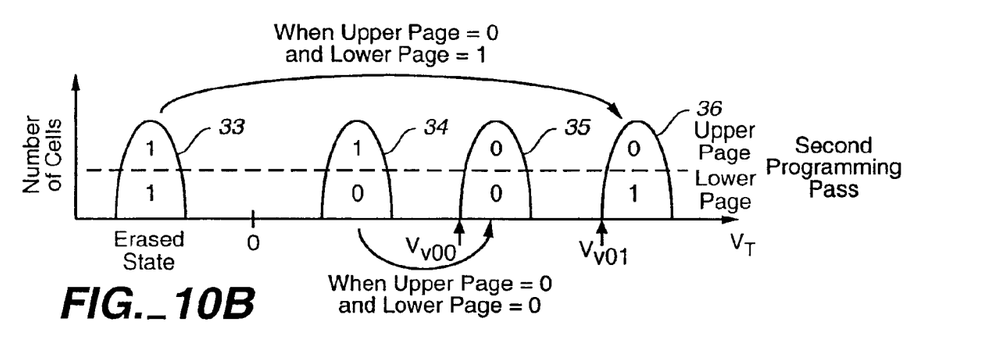

FIGS. 10A and 10B illustrate a specific existing technique of programming a 4-state NAND memory cell in an array of the type described above. In a first programming pass, the cell's threshold level is set according to the bit from the lower logical page. If that bit is a "1", nothing is done since it is in that state as a result of having been earlier erased. However, if that bit is a "0", the level of the cell is increased to the first programmed state 34. That concludes the first programming pass.

In a second programming pass, the cell's threshold level is set according to the bit being stored in the cell from the upper logical page. If a "1", no programming occurs since the cell is in one of the states 33 or 34, depending upon the programming of the lower page bit, both of which carry an upper page bit of "1". If the upper page bit is a "0", however, the cell is programmed a second time. If the first pass resulted in the cell remaining in the erased state 33, the cell is programmed from that state to the highest most state 36, as shown by the upper arrow FIG. 10B. If the cell has been programmed into the state 34, however, as a result of the first programming pass, the cell is further programmed in the second pass from that state to the state 35, as shown by the lower arrow of FIG. 10B. The result of the second pass is to program the cell into the state designated to store a "0" from the upper page without changing the result of the first pass programming.

Of course, if the memory is operated with more than four states, there will be a number of distributions within the defined voltage threshold window of the memory cells that is equal to the number of states. Further, although specific bit patterns have been assigned to each of the distributions, different bit patterns may be so assigned, in which case the states between which programming occurs can be different than those shown in FIGS. 10A and 10B. A few such variations are discussed in the patents previously referenced in the Background for NAND systems. Further, techniques for reducing the consequences of the Yupin effect in NAND and other types of memory arrays that are operated in multiple states are described in U.S. application Ser. No. 09/893,277, filed Jun. 27, 2001, by Jian Chen, Tomoharu Tanaka, Yupin Fong and Khandker N. Quader, entitled "Operating Techniques for Reducing Effects of Coupling Between Storage Elements of a Non-Volatile Memory Operated in Multiple Data States", now U.S. Pat. No. 6,522,580. This patent is also incorporated herein in its entirety by this reference.

Figure 11:
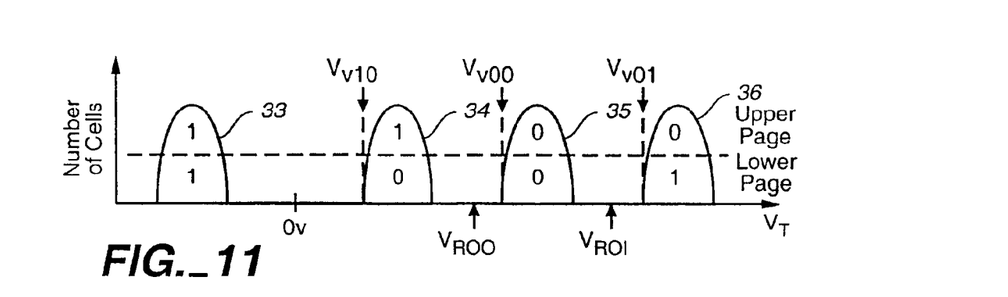
FIG. 11 reproduces the multi-state voltage threshold level distributions of FIGS. 10A and 10B with reading and verifying reference voltages added.

FIG. 11 illustrates the voltages used to read each cell in order to determine which of the four threshold states the cell lies. The voltages $V_{V10}$, $V_{V00}$ and $V_{V01}$ are reference voltages used to read the 10, 00 and 01 storage states of memory cells, respectively, during programming to verify their states. This verification normally occurs in between repetitive programming pulses. The programed distributions that result each have one of these program-verify voltages coincident with a lower edge of the distribution, as shown.

The voltages 0, $V_{R00}$ and $V_{R01}$, positioned roughly halfway between adjacent ones of the distributions 33–36, are used to read data from the memory cell array. These are the threshold voltages with which the threshold voltage state of each cell being read is compared. This is accomplished by comparing a current or voltage measured from the cell with reference currents or voltages, respectively. Margins exist between these read voltages and the programmed threshold voltage distributions, thus allowing some spreading of the distributions from disturbs and the like, as discussed above, so long as the distributions do not overlap any of the read voltages 0, $V_{R00}$ and $V_{R01}$. As the number of storage state distributions increases, however, this margin is reduced and the programming is then preferably carried out with more precision in order to prevent such spreading.

Operation of the Memory System with Two States per Storage Element

Two state operation of the multi-state memory described above is illustrated in FIG. 12. Only the first two states 33 and 36 of FIGS. 10 and 11 are programmed, being respectively labeled as 33' and 36' in FIG. 12. If the one data bit to be stored in a cell is a "1", then no action is taken with respect to that cell during a programming operation. Its threshold level remains within the erased threshold level distribution 33'. If the data bit to be stored in the cell is a "0", however, the cell is programmed in a manner illustrated in FIG. 9 to move its threshold level into the distribution 36'. This is done in the same manner as when, as illustrated in FIG. 10B, an upper page bit of "0" is programmed from the erased state 33 to the programmed state 36. The reference voltage $V_{V01}$ is used to verify the programming in the same manner as the multi-state case. One advantage of this technique is that it is quite easy to program some of the cells in two-states while the bulk of the memory is programmed in multiple states according to the techniques described above. Or, a memory integrated circuit chip is produced that can be set by a fuse or firmware setting within state machine 8 to operate the entire memory cell array in either multi-state or two-state. The programming remains the same when operating in two states as when operating in more than two states, except that programming of the lower page is omitted when operating in only two-states.

Reading of the individual cells uses the reference $V_{R00}$ to determine whether their threshold states fall within the erased distribution 33' or the programmed distribution 36'. This is different than a multi-state read, where the lower reference of 0 volts and the higher reference $V_{R01}$ are used (FIG. 11) to determine whether a cell is programmed into one of the states 33 or 36. Since no data has been programmed into the multi-state distributions 34 or 35 (FIG. 11) during two-state operation (FIG. 12), the non-zero reference $V_{R00}$, roughly in the middle of the distributions 33' and 36', is used to read the memory cells that have been programmed in two-states. This significantly increases the margins between these distributions and the reference used during reading than what it is during a multi-state read operation. More spreading and movement of those distributions, both actual and apparent, can, therefore, be tolerated in the two-state mode.

Figure 12:
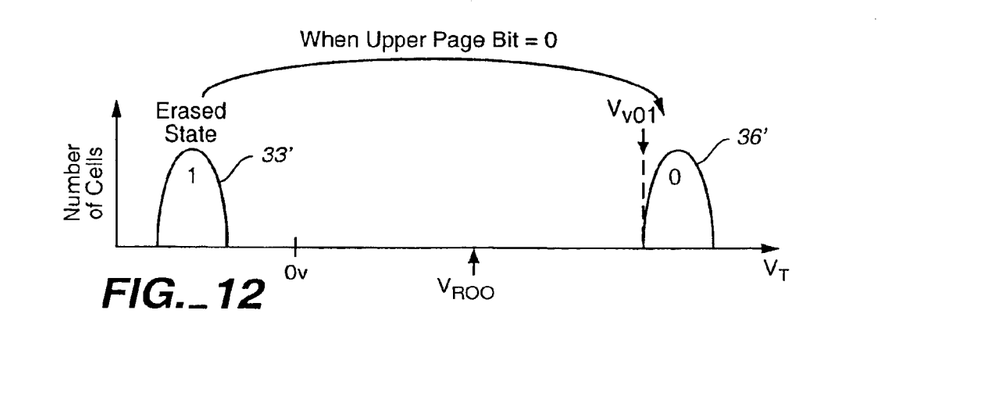
FIG. 12 shows voltage threshold level distributions of memory cells of the array of FIGS. 2–5 when programmed in two states.

A principal advantage of this technique is a reduction in the effects of the disturbance of charge levels of a programmed or erased cell that results from programming, reading and/or erasing operations. In particular, use of the non-zero, positive read threshold level $V_{R00}$ to read data increases the tolerance of the memory cells to the effects of read disturbs. As is known, the erase distribution 33' tends to move in a positive direction as a result of those cells and others in the same rows being read. And this effect becomes more prevalent as the memory cells are subjected to a large number of erase/programming cycles. In a majority of applications, the erased state is also one of the programmed states. When zero volts is used as a threshold breakpoint level to read cells within the negative threshold distribution 33', as described with respect to FIG. 11, a positive shift of that distribution over time can have the undesired effect of reaching zero volts and even becoming positive. This can also occur in existing two-state (binary) memory systems where zero volts is used during reading as a breakpoint between the two threshold levels to which the memory cells are programmed. But since the second programmed state distribution 36' of FIG. 12 is separated by a substantial margin from the erased distribution 33' as a result of programming with the $V_{R01}$ verify level, the higher reading threshold breakpoint $V_{R00}$ allows significantly more positive shifting of the distribution 33' before their stored states are misread. This is a significant advantage of maintaining the same threshold window for two-state operation as for multi-state operation.

Another advantage of the use of the increased margins of FIG. 12 is an increased length of time that data is retained. The distributions 33' and 36' can shift an increased amount before their data levels are misread by the threshold $V_{R00}$. The rate at which such shifts occur increases as the number of erase/programming cycles to which the memory cells are subjected increases. Therefore, the reduction of read disturbs and/or the increase in data retention also results in an increased lifetime of the memory.

The wider margins also allow the programming to be much faster per bit in the two-state case than in multiple-bit programming since the eventual threshold level of each programmed cell need not be contained in such a narrow distribution. A higher $\Delta V pgm$ (FIG. 9) or higher absolute voltages may be used to decrease the time necessary to program a cell, which will result in a broadening of the distribution 36' that can be tolerated with the higher margins.

There are many uses of a multi-state memory architecture that also provides for binary operation in the manner described above. A few of the blocks 1 (FIG. 2) of the memory system may be designated for two-state storage while the remaining blocks operate with multi-state storage. This is set within the state machine 8, wherein the number of storage states during programming and reading depends upon the physical address, or an address related to the physical address, of the block to which data are being programmed or read.

In a particular application, memory cell blocks to which data are written most frequently are operated in two states while the remaining blocks that are rewritten less frequently are operated in multi-state. Examples of data that are rewritten frequently include a table of blocks of memory in which user data are stored, such as a system file allocation table (FAT), block cycle counts and other overhead data that are stored as part of operating a flash EEPROM system. With regard to the FAT table, its frequent updates can be easily identified in those host systems that designate a lesser amount of data to be written when updating the FAT table than when storing user data. Such identified FAT table data is then directed by the controller 20 (FIG. 1) to a block operating in two states. With regard to memory cell block experience counts and other such overhead data, the controller 20 knows the blocks to which such data are written, so operation of those blocks is set to two states. The pre-mature need to replace blocks that have reached their endurance limit is at least controlled somewhat, if not eliminated altogether.

Another application of the invention is to switch at least some of the blocks of the memory array from multi-state to two-state operation when it becomes advantageous to do so through the life of the memory. This can be done dynamically, for example, for blocks that are receiving far more data rewrites than other blocks. Another example is to switch operation to two-state of selected blocks that are approaching their endurance limit number of erase/programming cycles when operating in multi-state. Although conditions of the memory cells may preclude continued multi-state operation, they may be operated in two-states thereafter according to the technique described with respect to FIG. 12. Of course, twice the number of blocks needs to be used for storing the same amount of data in two states as in four states. Counts of the number of erase/programming cycles of the individual blocks or groups of blocks should then be maintained, in order to provide the state machine 8 with data from which it can be determined when to switch blocks from one form of operation to the other. The keeping of such counts in the individual blocks being counted is described in U.S. Pat. No. 5,043,940. Alternatively, cycle counts may be maintained together in different blocks than those being counted, as described in U.S. application Ser. No. 09/505,555, filed Feb. 17, 2000, now U.S. Pat. No. 6,426,893. A particular technique of generating the cycle count is described in U.S. application Ser. No. 09/662,032, filed Sep. 14, 2000, now U.S. Pat. No. 6,345,001. The foregoing patents are hereby incorporated herein by this reference.

In the description above of particular examples of the present invention, multi-state operation has included four states. Of course, multi-state operation can involve more than four states, such as eight or sixteen, wherein the threshold voltage distributions are kept much narrower and margins between them made smaller than what is shown in FIGS. 10 and 11 for four states. Further, although a two state mode has been described as an alternative to provide greater margins, extend life and increase the efficiency of programming, the alternative can utilize more than two storage states that are less than the number of states used in normal operation. For example, if normal multi-state operation programs and reads sixteen states, the alternative can be restricted to four of those storage states that are separated the maximum amount, the lowest, the highest and two others equally spaced between them.

Alternate use of Dielectric Storage Elements

The forgoing examples of flash EEPROM memory cells have been described with respect to the type of cell that utilizes conductive floating gates as charge storage elements. However, the present invention may also be implemented in a system that uses a charge trapping dielectric as the storage elements in individual memory cells in place of floating gates. The dielectric storage element is sandwiched between a conductive control gate and the substrate within the cell's channel region. Although the dielectric can be separated into individual elements with the same sizes and positions as the floating gates, it is usually not necessary to do so since charge is trapped locally by such a dielectric. The charge trapping dielectric can extend over the entire array except in areas occupied by the select transistors or the like.

Dielectric storage element memory cells are generally described in the following technical articles and patent, which articles and patent are incorporated herein in their entirety by this reference: Chan et al., "A True Single-Transistor Oxide-Nitride-Oxide EEPROM Device," *IEEE Electron Device Letters*, Vol. EDL-8, No. 3, March 1987, pp. 93–95; Nozaki et al., "A 1-Mb EEPROM with MONOS Memory Cell for Semiconductor Disk Application," *IEEE Journal of Solid State Circuits*, Vol. 26, No. 4, April 1991, pp. 497–501; Eitan et al., "NROM: A Novel Localized Trapping, 2-Bit Nonvolatile Memory Cell," *IEEE Electron Device Letters*, Vol. 21, No. 11, November 2000, pp. 543–545, and U.S. Pat. No. 5,851,881.

There are two specific charge trapping dielectric materials and configurations that are practical for use. One is a three-layer dielectric with silicon dioxide initially grown on the substrate, a layer of silicon nitride deposited thereover and another layer of silicon oxide, grown and/or deposited, over the silicon nitride layer ("ONO"). A second alternative is a single layer of silicon rich silicon dioxide sandwiched between the gate and the semiconductor substrate surface. This later material is described in the following two articles, which articles are incorporated herein in their entirety by this reference: DiMaria et al., "Electrically-alterable read-only-memory using Si-rich $SiO_2$ injectors and a floating polycrystalline silicon storage layer," *J. Appl. Phys.* 52(7), July 1981, pp. 4825–4842; Hori et al., "A MOSFET with Si-implanted Gate-$SiO_2$ Insulator for Nonvolatile Memory Applications," IEDM 92, April 1992, pp. 469–472.

Conclusion

Further, although the present invention has been described in terms of specific examples and variations thereof, it is understood that the invention is to be protected within the full scope of the appended claims.

It is claimed:

1. In a memory system, a method of controllably operating a plurality of blocks of re-programmable non-volatile memory cells in either at least four threshold level states or exactly two threshold level states, wherein said at least four threshold level states are spaced apart across a memory cell operating threshold window and said exactly two threshold level states are those of the four threshold level states that are maximally separated from each other within the operating threshold window, and wherein designations of whether the individual blocks of memory cells operate with at least four threshold level states or exactly two threshold level states are maintained within the memory system and accessed by physical addresses used to access the blocks.

2. The method of claim 1, wherein the memory cells within at least one of the plurality of blocks is operated in said exactly two threshold level states and the memory cells within at least another one of the plurality of blocks is operated in said at least four threshold level states.

3. The method of claim 2, wherein a file allocation table (FAT) table of blocks of memory in which user data are stored is written into memory cells of said at least one of the plurality of blocks that is operated in said exactly two threshold levels, and the user data is stored in memory cells of said at least another one of the plurality of blocks that is operated in said at least four threshold level states.

4. The method of claim 1, wherein at least one of said plurality of blocks of memory cells is initially operated in said at least four threshold level states until a number of erase/programming cycles of said at least one block reaches a predetermined amount, upon which said at least one block is then operated in said at least two threshold level states.

5. In a memory system having a plurality of blocks of non-volatile memory cells that individually stores more than one bit of data in one of at least four threshold level states that are spaced apart across an operating threshold window, a method of operating the memory system comprising storing one bit of data in the memory cells of at least one of the blocks in only two of said at least four threshold level states that are furthest displaced from each other within the operating threshold window, wherein a spread of threshold level values of the memory cells within the individual threshold level states is greater in the case where one bit of data are stored in the memory cells than in the case where more than one bit of data are stored.

6. The method of claim 5, which additionally comprises reading data from the individual cells of said at least some of the blocks that are stored in said only two of the four threshold level states by use of a threshold reference having a value intermediate of others of said at least four threshold level states than said only two threshold level states furthest displaced from each other.

7. In a memory system having a plurality of blocks of non-volatile memory cells that individually stores more than one bit of data in one of at least four threshold level states that are spaced apart across an operating threshold window, a method of operating the memory system comprising storing one bit of data in the memory cells of at least one of the blocks in oly two of said at least four threshold level states that are furthest displaced from each other within the operating threshold window, wherein a spread of threshold level values of the memory cells within the individual threshold level states is greater in the case where one bit of data are stored in the memory cells than in the case where more than one bit of data are stored wherein one of said only two threshold level states furthest displaced from each other is an erased state within a negative region of the operating threshold window and said read threshold reference is a non-zero positive voltage, and which additionally comprises reading data from the induvidual cells of said at least some of the blocks that are stored in said only two of the four threshold level states by use of a threshold reference having a value intermediate of others of said at least four threshold level states than said only two threshold level states furthest displaced from each other.

8. In a memory stystem having a plurality of blocks of non- volatile memory cells that individually stores more than one bit of data in one of at least four threshold level states that are spaced apart across an operating threshold window, wherein the memory system is a NAND system, a method of operating the memory system comprising storing one bit of data in the memory cells of at least one of the blocks in only two of said at least four threshold level states that are furthest displaced from each other within the operating threshold window, wherein a spread of threshold level values of the memory cells within the individual threshold level states is greater in the case where one bit of data are stored in the memory cells than in the case where more than one bit of data are stored.

9. In a flash non-volatile memory system with memory cells connected in a NAND arrangement, wherein at least two bits are normally programmed in sequence into individual ones of the memory cells from at least two different pages of data, a method of programming only one bit into some of the system's memory cells comprising programming one bit from one of said at least two pages into individual ones of said some of the system's memory cells in the same manner as when normally programmed as one of two bits but without allowing programming of the second bit from the other of said at least two pages into said some of the system's memory cells.

10. A method of operating a memory system having a plurality of units of re-programmable non-volatile semiconductor memory cells that are erased prior to reprogramming, which comprises:

programming user data received from outside the memory system into the memory cells of a first group of one or more units by a first plurality of threshold level states, wherein the first plurality of threshold level states are spaced apart across an operating threshold window of the memory cells, and programming other data that are rewritten more frequently than the user data into the memory cells of a second group of one or more units by a second plurality of threshold level states less than the first plurality, the second plurality of threshold level states including those of the first plurality of threshold level states that are maximally separated from each other within the operating threshold window.

11. The method of claim 10, wherein the other data include a system file allocation table (FAT).

12. The method of claim 10, wherein the other data include overhead information generated within the memory system to manage operation thereof.

13. A method of operating a memory system having a plurality of units of re-programmable non-volatile semiconductor memory cells, comprising:

initially storing data in the individual memory cells of at least one of the units within one of a first plurality of threshold level states spaced apart across an operating threshold window, monitoring when the usage of said at least one of the units reaches an endurance limit of a number of erase/programming cycles, and thereafter storing data in the individual memory cells of said at least one of the units within one of a second plurality of threshold level states spaced apart across the operating threshold window, the second plurality of threshold level states being less than the first plurality of threshold level states.

14. The method of claim 13, additionally comprising maintaining counts of the number of erase/programming cycles of the individual units, wherein said at least one unit operates with the first plurality of threshold level states until the cycle count of said at least one unit reaches a preset number, after which said at least one unit operates with the second plurality of threshold level states.

15. The method of claim 13, wherein the second plurality of threshold level states are limited to those of the first plurality of threshold level states that are maximally separated from each other across the operating window.

16. A method of operating a memory system having a plurality of units of re-programmable non-volatile semiconductor memory cells that are erased prior to reprogramming, which comprises:

programming data into the memory cells of a first group of one or more units into a first plurality of threshold level states by a succession of pulses that incrementally increase in magnitude by a first difference, wherein the first plurality of threshold level states are spaced apart across an operating threshold window of the memory cells, and programming data into the memory cells of a second group of one or more units into a second plurality of threshold level states less than the first plurality of threshold level states by a succession of pulses that incrementally increase in magnitude by a second difference larger than the first difference, whereby a spread of threshold levels within the second plurality of threshold level states is wider than a spread of threshold levels within the first plurality of threshold level states.

17. The method of claim 16, wherein the second plurality of threshold level states are limited to two threshold level states that are maximally separated from each other within the operating threshold window.

18. A memory system, comprising:

an array of non-volatile memory cells having re-programmable charge storage elements organized into blocks that are simultaneously erasable, and programming circuits that program two or more bits of data into the individual charge storage elements from two or more pages of user data in corresponding two or more successive programming operations to cause levels of charge stored on the individual charge storage elements to be within one of at least four non-overlapping ranges but that limits the programming of the charge storage elements in a designated one or more of the blocks to control charge levels stored on the charge storage elements therein to only two of the at least four ranges by implementing only one of the two or more successive programming operations, thereby to store only one bit of data per charge storage element in the designated one or more blocks wherein said only two of the at least four ranges have a margin therebetween extending across intervening of the at least four ranges.

19. The memory system of claim 18, wherein the programming circuits implement said one of the two or more successive programming operations on the charge storage elements of the designated one or more blocks by applying successive programming pulses having differences in magnitude greater than that between successive programming pulses applied during the two or more successive programming operations that cause levels of charge stored on the individual charge storage elements to be within one of at least four non-overlapping ranges.

20. The memory system of claim 18, wherein the programming circuits program system operating data into the designated one or more blocks that are rewritten more frequently than the user data.

21. The memory system of claim 20, wherein the system operating data programmed into the designated one or more blocks include a system file allocation table (FAT).

22. The memory system of claim 18, wherein the programming circuits dynamically identify a given block as one of the designated blocks in response to the given block reaching an endurance limit of a number of erase/programming cycles.

23. The memory system of claim 18, wherein the plurality of memory cells include a plurality of series strings of at least eight memory cell transistors that extend in one direction across a semiconductor substrate between bit lines and a voltage source, and word lines extending across the strings in a second direction across the substrate, the first and second directions being orthogonal to each other, the charge storage elements being located within the strings of memory cell transistors where crossed by the word lines.

24. The memory system of claim 18, wherein the programming circuits include a state machine.

25. The memory system of claim 18, wherein the charge storage elements are electrically conductive floating gates.

* * * * *